United States Patent
Fehle et al.

(10) Patent No.: US 8,059,375 B2
(45) Date of Patent: Nov. 15, 2011

(54) CIRCUIT ARRANGEMENT AND METHOD FOR THE PROTECTION OF A CIRCUIT AGAINST ELECTROSTATIC DISCHARGES

(75) Inventors: Jürgen Fehle, Graz (AT); Michael Mark, Graz (AT); Christian Russ, Diedorf (DE)

(73) Assignee: Infineon Technologies AG, Munich (DE)

( * ) Notice: Subject to any disclaimer, the term of this patent is extended or adjusted under 35 U.S.C. 154(b) by 655 days.

(21) Appl. No.: 11/766,993

(22) Filed: Jun. 22, 2007

(65) Prior Publication Data

US 2008/0043389 A1    Feb. 21, 2008

Related U.S. Application Data

(63) Continuation-in-part of application No. PCT/EP2005/012690, filed on Nov. 28, 2005.

(30) Foreign Application Priority Data

Dec. 23, 2004   (DE) .................... 10 2004 062 205

(51) Int. Cl.
*H02H 9/00* (2006.01)
*H02H 3/22* (2006.01)

(52) U.S. Cl. .......................................... 361/56; 361/111

(58) Field of Classification Search .................... 361/56, 361/111
See application file for complete search history.

(56) References Cited

U.S. PATENT DOCUMENTS

| | | | |
|---|---|---|---|
| 5,610,791 A * | 3/1997 | Voldman | 361/56 |
| 5,946,177 A | 8/1999 | Miller et al. | |
| 6,534,833 B1 | 3/2003 | Duvvury et al. | |
| 7,242,561 B2 * | 7/2007 | Ker et al. | 361/56 |
| 2005/0068702 A1 * | 3/2005 | Connor et al. | 361/56 |

FOREIGN PATENT DOCUMENTS

| | | |
|---|---|---|
| EP | 0740344 | 10/1996 |
| WO | 0225734 | 3/2002 |

OTHER PUBLICATIONS

International Search Report and Written Opinion (in German) from PCT/EP2005/012690, dated Feb. 23, 2006.

* cited by examiner

*Primary Examiner* — Jared Fureman
*Assistant Examiner* — Lucy Thomas
(74) *Attorney, Agent, or Firm* — Banner & Witcoff, Ltd.

(57) ABSTRACT

Illustrative apparatuses and methods for electrostatic discharge protection are described in which the frequency of a voltage received at a first circuit node is filtered to generate a filtered voltage, one or more control signals are generated having either a first voltage or a second voltage depending upon the value of the filtered voltage, and the first circuit node is selectively connected with a second circuit node depending upon the value of the one or more control signals.

7 Claims, 8 Drawing Sheets

CIRCUIT ARRANGEMENT AND METHOD FOR THE PROTECTION OF A CIRCUIT AGAINST ELECTROSTATIC DISCHARGES

CROSS-REFERENCE TO RELATED APPLICATIONS

This application claims priority under 35 U.S.C. §120 and 35 U.S.C. §365(c) to, and is a continuation-in-part of, co-pending international PCT Application PCT/EP2005/ 012690, filed Nov. 28, 2005, which claims priority to German Patent Application DE 10 2004 062 205.1, filed Dec. 23, 2004, each of which is hereby incorporated by reference as to its entirety.

BACKGROUND

Modern integrated circuits (ICs) can easily be damaged by the application of too high a voltage. This may especially result in irreversible damage to gate oxides of metal-oxide-semiconductor (MOS) field-effect transistors in the circuit. Such a high voltage may be transferred to the integrated circuit in particular by an electrostatic discharge (ESD), for example if a person touches terminals of the integrated circuit. Thus it is known to equip integrated circuits with circuit arrangements to protect against ESDs, by which an ESD is diverted to ground, whereby this diversion path is non-conductive in normal operation of the circuit. For this purpose, an appropriately dimensioned negative-channel MOS (NMOS) component is coupled between a terminal of the circuit to be protected and a grounding line, whereby the NMOS component has a blocking behavior during normal operation of the circuit and becomes conductive when an ESD is applied to the terminal.

In the course of the increasing miniaturization of ICs, such as complementary MOS (CMOS) integrated circuits, core supply voltages of circuits (i.e., supply voltages that supply the majority of the circuit) have fallen steadily. By comparison, supply voltages of input/output interfaces (IO interfaces) have remained substantially the same in order to maintain backward compatibility with circuits operated with higher supply voltages.

Such IO interfaces are typically configured such that they can frequently receive signals having a voltage that is even greater than the supply voltage for said IO interfaces or discharge a signal voltage higher than the supply voltage. Such an IO interface is referred to as "over-voltage tolerant IO."

In some cases, provision is made for different supply voltages in integrated circuits. For example, a chip manufactured in DSM (deep submicron)-CMOS technology, which is usually operated with a supply voltage of 3.3 V, may additionally have a supply voltage terminal for a voltage of 5 V. This may be used to equip the chip with a voltage controller by way of which the chip is supplied with a 5 V voltage supply in an environment where a 3.3 V voltage supply is not available, or to provide appropriate IO interfaces. Such a voltage controller is formed substantially by a single MOS transistor without any problems arising due to degradation of gate oxides since such a MOS transistor, for example a positive-channel MOS (PMOS) transistor, is only connected between the external 5 V supply voltage and the internally generated 3.3 V supply voltage, such that the entire voltage of 5 V does not drop via the transistor, for example between drain and gate, source and gate, or gate and bulk.

Generally, however, a corresponding ESD protective circuit arrangement is connected between the supply voltage, in this case 5 V, and ground. Thus with 3.3 V technology, an ESD protective arrangement based on a single NMOS transistor connected between the supply voltage and ground may suffer from reliability problems since the result might be a degradation of the gate oxide due to the high voltage drop.

It is known, therefore, in such circuits to use two stacked NMOS protective elements so that only a portion of the voltage applied during normal operation of the relevant circuit drops at each protective element.

In such a circuit arrangement, a circuit or circuit section to be protected has a first terminal for a supply voltage and a second terminal for a grounding cable. Between the first terminal and the second terminal are connected two stacked NMOS transistors. Gate terminals of the NMOS transistors are interconnected via resistors to second terminal.

In normal operation of such a circuit, the gate terminals of the NMOS transistors are at ground potential such that the NMOS transistors close and thus no current flows across the NMOS transistors.

Now, if a high voltage is present on the first terminal because of an electrostatic discharge, then the voltage on the gate terminal of one of the NMOS transistors also rises rapidly due to capacitive coupling between the gate terminal of that NMOS transistor and the drain terminal of that NMOS transistor interconnected to the first terminal. By means of further capacitive coupling between the gate terminal of that NMOS transistor and the source terminal of that NMOS transistor (which is interconnected to the drain terminal of the other NMOS transistor) and capacitive coupling between the drain terminal of the other NMOS transistor and the gate terminal of that other NMOS transistor, the voltage at the gate terminal of that other NMOS transistor also increases. At the same time, the resistors have the effect that a voltage other than ground can actually be present at the gate terminals of the NMOS transistors for at least a short time, i.e. during an electrostatic discharge.

The potential effect of this is that the NMOS transistors may become conductive as a breakdown field strength of the NMOS transistors is reached, and thus the electrostatic discharge can drain from the first terminal to ground, i.e. to the second terminal.

Such a circuit may have the disadvantage that the increased voltage at the gate terminals of the NMOS transistors is generally not available for the entire duration of a typical ESD pulse (on the order of magnitude of 150 nanoseconds), which may lead to an increased voltage drop at the NMOS transistors and at the circuit to be protected. Furthermore, such a circuit may not be usable with over-voltage tolerant IO interfaces unless the NMOS transistors are used and that are compatible with the increased supply voltage. This, in turn, however, may incur additional barely acceptable technological investment

SUMMARY

Various aspects will be described herein. For example, various apparatuses and methods for electrostatic discharge protection will be described in which the frequency of a voltage received at a first circuit node is filtered to generate a filtered voltage, one or more control signals are generated having either a first voltage or a second voltage depending upon the value of the filtered voltage, and the first circuit node is selectively connected with a second circuit node depending upon the value of the one or more control signals.

These and other aspects of the disclosure will be apparent upon consideration of the following detailed description of illustrative aspects.

BRIEF DESCRIPTION OF THE DRAWINGS

A more complete understanding of the present disclosure may be acquired by referring to the following description in consideration of the accompanying drawings, in which like reference numbers indicate like features, and wherein.

DETAILED DESCRIPTION

Figure 1:
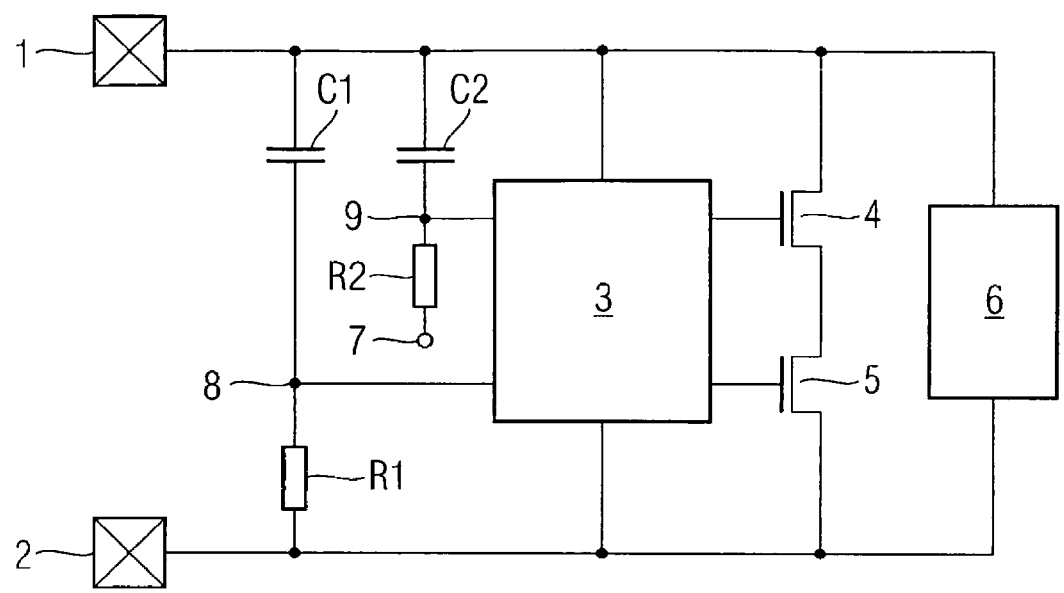
FIG. 1 is a schematic diagram of an illustrative embodiment of a circuit arrangement according to various aspects as described herein.

The various aspects summarized previously may be embodied in various forms. The following description shows by way of illustration various examples in which the aspects may be practiced. It is understood that other examples may be utilized, and that structural and functional modifications may be made, without departing from the scope of the present disclosure.

Except where explicitly stated otherwise, all references herein to two or more elements being "coupled," "connected," and "interconnected" to each other is intended to broadly include both (a) the elements being directly connected to each other, or otherwise in direct communication with each other, without any intervening elements, as well as (b) the elements being indirectly connected to each other, or otherwise in indirect communication with each other, with one or more intervening elements.

In general, a circuit arrangement may be provided for the protection of a circuit against electrostatic discharges (ESDs), which may be designed to process a voltage that is different from a core supply voltage of the circuit. Such a circuit arrangement may be intended to enable reliable operation over the entire duration of an ESD pulse and may be capable of being implemented using components designed for the circuit's core supply voltage.

For example, according to some embodiments, a circuit arrangement may be provided having a first protective element and a second protective element, wherein a first terminal of the first protective element is coupled to a circuit terminal or other circuit node to be protected, wherein a second terminal of the first protective element is interconnected to a first terminal of the second protective element and wherein a second terminal of the second protective element is interconnected to a first potential.

The circuit arrangement according to these embodiments may include a first filter interconnected to the circuit terminal to be protected and the first potential, which may be designed such to provide a first control potential at an output, the first control potential assuming a first value during normal operation of the circuit, whereas on the occurrence of an electrostatic discharge at the terminal to be protected the first control potential may assume a second value different from the first value. The circuit arrangement may further include a second filter interconnected to a second potential as well as to the circuit terminal to be protected, or to the first potential, which may be designed such to provide a second control potential at an output. The second control potential may assume a second value during normal operation of the circuit, whereas on the occurrence of an electrostatic discharge at the terminal to be protected, the second control potential may assume a value that is different from the second value.

Moreover, such a circuit arrangement may further include a control portion interconnected to the output of the first filter, the output of the second filter, a control input of a first protective element and a control input of a second protective element. These may be designed to activate the first protective element and the second protective element depending on the first control potential and the second control potential such that, during normal operation of the circuit, the first protective element and/or the second protective element has a blocking behavior between its first terminal and its second terminal, whereas on the occurrence of an electrostatic discharge, both the first protective element and also the second protective element may be conductive between its respective first terminal and its respective second terminal.

By using the first and second filters and the corresponding control portion, the first protective element and the second protective element may be activated substantially for the entire duration of an ESD pulse in such a manner that little to no overly high voltages are applied to the circuit to be protected as well as to the first protective element and the second protective element.

In various embodiments, the first protective element and the second protective element may be or otherwise include, for example, MOS transistors such as NMOS transistors.

In some embodiments, the circuit arrangement may be designed such that, during normal operation of the circuit, the voltages at the control inputs as well as at the first and second terminals of the MOS transistors are adjusted so that degradation of the gate oxides of the MOS transistors is reduced or even prevented, and thus reliable function of the circuit arrangement may potentially be provided.

At the same time, the circuit terminal to be protected may, in various embodiments, be a terminal for a potential or a supply voltage, wherein the first potential is greater than the second potential. For example, the terminal to be protected may be a terminal for a 5 V supply voltage, the first potential may be a ground potential, and the second potential may be a 3.3 V supply voltage. Various embodiments are, of course, also suitable for other voltages and potentials.

The first filter and/or the second filter may in each case be interconnected by way of one or more resistors and/or by way of one or more capacitors to the corresponding potentials or terminals, whereby a time constant of the relevant filter arises from the resistors and capacitors.

Furthermore, the filters may be designed as high pass and/or low pass filters, whereby the time constant thus corresponds to the reciprocal cut-off frequency. This time constant may lie between a typical rise time of ESD events and a time constant that describes a change in a signal applied to the terminal to be protected or a change in a supply voltage applied to the terminal to be protected.

The control portion may include, for example, a plurality of driver stages connected in series, whereby inputs of a first of the driver stages are interconnected to the outputs of the first and second filters, and outputs of a last of the driver stages are interconnected to the control inputs of the first protective element and the second protective element.

In some embodiments, a feedback path may be provided from the control input of the first and/or second protective element to an input of the control portion.

In the various illustrative embodiments that will be described subsequently, it will be assumed by way of example that a terminal of an integrated circuit for a supply voltage of 5 V is to be protected against electrostatic discharges, whereas the circuit is designed in general for a supply voltage of 3.3 V. However, various embodiments are usable for other voltages and for terminals at which signals other than a supply voltage are applied.

Turning to the figures, FIG. 1 is a schematic diagram of an illustrative circuit arrangement according to various aspects as described herein. In this example, a circuit 6 to be protected has a terminal 1 for a supply voltage of 5 V and a terminal 2 for a ground potential (GND). In this disclosure, the term "circuit" includes but is not limited to a complete circuit, and may include merely a portion of a complete circuit, for instance a portion of an integrated circuit. The entirety of the arrangement of FIG. 1 may also be integrated into this integrated circuit. In addition, circuit 6 may generally also have further terminals, such as input/output terminals (IO terminals), that are protected by further ESD protective circuits.

In the present example, terminal 1 is to be protected against electrostatic discharges that might damage circuit 6. Provided for this as protective elements are two stacked NMOS transistors 4 and 5 that are connected between terminal 1 and terminal 2 as shown in FIG. 1. As will be subsequently explained, during normal operation of the circuit, at least one of NMOS transistors 4 or 5 may always be blocking. Normal operation of the circuit here is to be understood as such operation during which no electrostatic discharges or similar disruptive events occur at terminal 1. In the event of an electrostatic discharge, on the other hand, NMOS transistors 4 and 5 may be switched so as to be conductive. This may result in the electrostatic discharge being diverted to ground, i.e. to terminal 2, by way of NMOS transistors 4, 5 with only a slight drop in voltage. Corresponding activation of NMOS transistors 4 and 5 may be carried out by way of a first filter circuit, such as a filter circuit including a resistor R1 and a capacitor C1, a second filter circuit including a resistor R2 and a capacitor C2, and/or a control or driver circuit 3.

Capacitor C1 of the first filter circuit may be coupled to terminal 1 and a circuit node 8, and resistor R1 of the first filter circuit may be coupled to terminal 2 and likewise to circuit node 8. An output signal of the first filter circuit may be picked up at circuit node 8 and routed to driver circuit 3. The second filter circuit may constructed so as to be the same as or different from the first filter circuit. In the present example, capacitor C1 is interconnected to terminal 1 and a circuit node 9, and resistor R2 is interconnected to circuit node 9 and a supply voltage 7, whereby supply voltage 7 is the core supply voltage of 3.3 V.

During normal operation of the circuit, a ground potential may be present at terminal 2, and at terminal 1 the supply voltage of 5 V may be present, and which may not change or may change slowly. As a result, the impedance of capacitor C1 may be substantially higher than the impedance of resistor R1, and the ground potential may be substantially present at circuit node 8. Compared with normal fluctuations of the supply voltage at terminal 1 or the change in voltage at terminal 1 when the supply voltage is switched on, electrostatic discharges may have substantially faster voltage rise times, such as on the order of magnitude of about 10 nanoseconds. As a result, upon the occurrence of the rapidly rising voltage of an electrostatic discharge at terminal 1, the voltage present at circuit node 8 may be increased by way of capacitor C1 such that a correspondingly higher voltage level is routed to control circuit 3.

Capacitor C1 and resistor R1 may be thus connected as high-pass filters with reference to the transmission of a voltage applied at terminal 1 to circuit node 8. The values for capacitor C1 and resistor R1 in various embodiments may be selected such that the high-pass filter is not permeable for changes in the supply voltage at terminal 1 during normal operation of the voltage. In other words, circuit node 8 may be kept at ground, whereas it is at least partially permeable for ESD pulses. Examples of component values here are, for example, R1=about 50 kΩ and C1=about 1 pF, which corresponds to a time constant of R1×C1 of about 50 nanoseconds. Of course, such a time constant (or different time constants) may also be achieved with other values for R1 and C1.

The second filter circuit with capacitor C2 and resistor R2 may be constructed analogously to the first filter circuit. In particular, capacitor C2 may have the same value as capacitor C1 and resistor R2 the same value as resistor R1. Since in the case of the second filter circuit, resistor R2 is connected to supply voltage 7, circuit node 9 has a voltage corresponding to supply voltage 7 during normal operation of the circuit, that is to say, 3.3 V in the present example, whereas the voltage at circuit node 9 may increase accordingly upon application of an electrostatic discharge. Depending on the voltages present at circuit nodes 8 and 9, driver circuit 3 may then activate NMOS transistors 4 and 5 as described above. At the same time, driver circuit 3 may be designed for operation with the supply voltage of 5 V applied at terminal 1, thus it may be compatible with the voltage of 5 V. This may also be achieved using components designed for the supply voltage of 3.3 V.

In addition, the time constants of the first filter circuit and the second filter circuit in various embodiments may be chosen such that the corresponding potentials at circuit nodes 8 and 9 are available for long enough throughout the duration of an ESD pulse (for example, approximately 150 nanoseconds) to provide for safe discharging of the charge.

At the same time, NMOS transistors 4 and 5 may have a width W on the order of magnitude of about 1,000 μm and a minimum gate length for the technology used, which may, for example, be on the order of magnitude of about 0.18 μm.

Various illustrative implementations of control or driver circuit 3 will now be described with reference to FIGS. 2 to 4.

Figure 2:
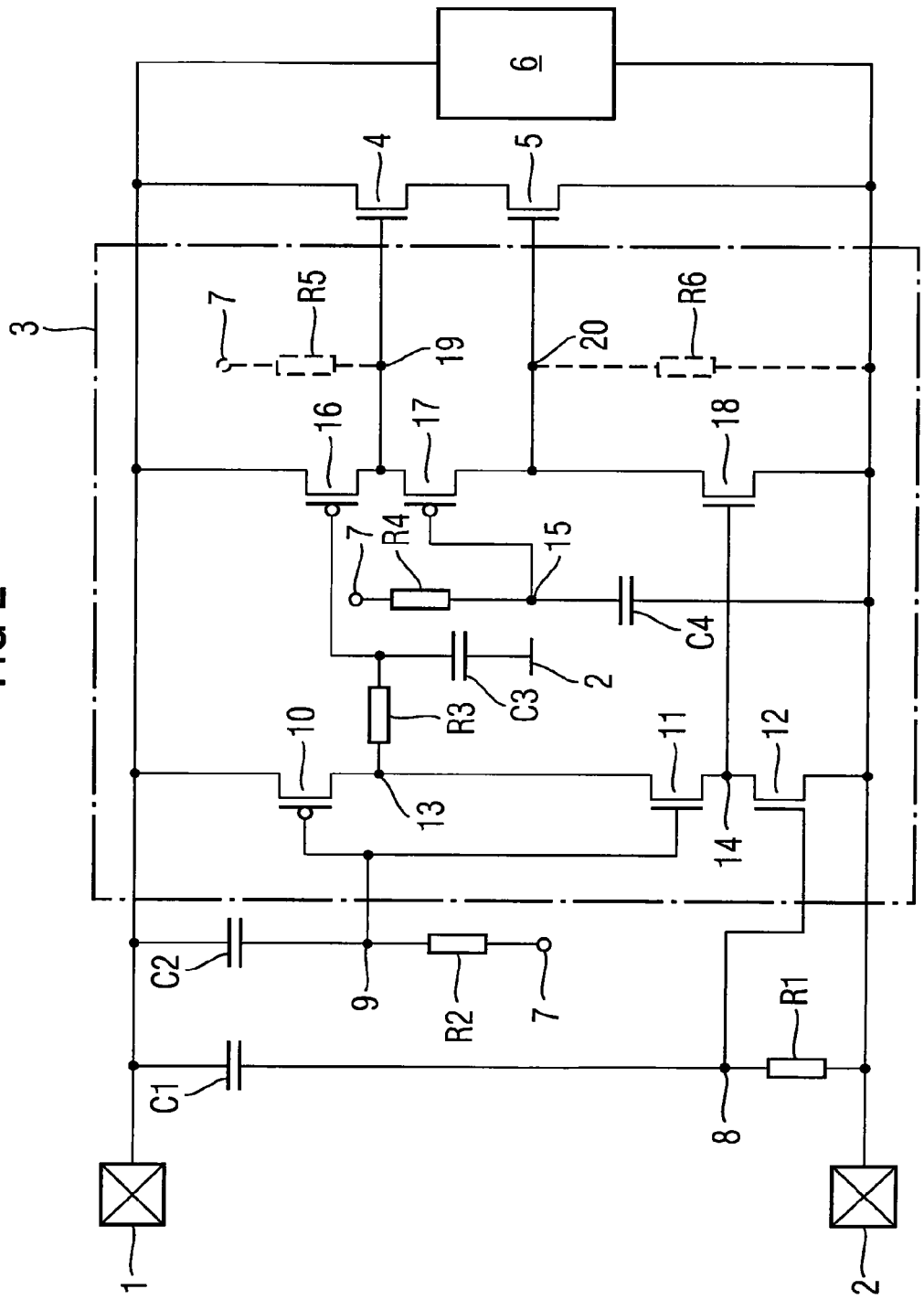
FIG. 2 is a schematic diagram of an illustrative wired-circuit embodiment of the circuit arrangement from FIG. 1.

FIG. 2 shows an illustrative embodiment of driver circuit 3 together with the further circuit sections already discussed in relation to FIG. 1. Driver circuit 3 presented in FIG. 2 includes two driver stages. In this example, a first driver stage is formed by a PMOS transistor 10 and a pair of stacked NMOS transistors 11 and 12, and a second driver stage is formed by a pair of stacked PMOS transistors 16 and 17 and an NMOS transistor 18. In addition, the driver circuit includes resistors R3, R4 and capacitors C3, C4, which are interconnected as shown in FIG. 2. The values of R3, R4, C3 and C4 may at the same time correspond to those of the first filter circuit and/or the second filter circuit.

During normal operation of the circuit in connection with FIG. 2, a supply voltage of 5 V may be present at terminal 1 and a ground potential may be present at terminal 2. Reference numeral 7 denotes, as already explained, an illustrative core or internal supply voltage of 3.3 V. As a result, circuit node 8 is at ground potential and circuit node 9 is on 3.3 V.

This means that the gate terminal of NMOS transistor 12 is at ground potential and is thus blocking. A potential of 3.3 V may be present in each case at the gate terminals of NMOS transistor 11 and PMOS transistor 10. PMOS transistor 10 thus may be conductive and the voltage at circuit node 13 thus may be 5 V. As NMOS transistors 11 and 12 are stacked NMOS transistors in the present example, the voltage at circuit node 14 may be 3.3 V−Vtn, where Vtn is a threshold voltage of NMOS transistor 11 and 12 respectively. It may be that the full voltage of 5 V is not present between gate and source, gate and drain, or gate and bulk, of transistors 10, 11, 12, and rather in every case a significantly lower tolerable voltage for the transistors may occur such that little or no reliability problems are experienced with respect to the gate oxides. In this example, Vtn may be on the order of magnitude of about 0.4 to about 0.8 V.

In the shown example, a gate terminal of NMOS transistor 18 is connected to circuit node 14 and is thus at 3.3 V-Vtn, which may cause NMOS transistor 18 to be in a conductive state. As a result, circuit node 20 is pulled to ground potential, thereby keeping NMOS transistor 5, the gate terminal of which is connected to circuit node 20, in a blocking state. This may result in no current flowing across NMOS transistors 4 and 5.

As already stated, during normal operation of the circuit, circuit node 13 lies on the potential of terminal 1, that is on 5 V in this example. Circuit node 13 is interconnected by way of a third filter circuit, which may be formed from a resistor R3 and a capacitor C3, to a gate terminal of PMOS transistor 16. At the same time, the gate terminal of PMOS transistor 16 is connected via resistor R3 to circuit node 13 and via capacitor C3 to ground, identified by reference numeral 2 corresponding to ground terminal 2. The third filter circuit may correspond from the dimensioning point of view to the first filter circuit and the second filter circuit may, however, be connected as a low-pass filter such that during normal operation of the circuit, the voltage present at circuit node 13 (5 V) is applied to the gate terminal of transistor 16. This voltage may be pulled down towards ground in the event of an ESD pulse. Thus, PMOS transistor 16 would be in a blocked state. At the same time, the third filter circuit if included may improve the function of the circuit. In this case, resistor R3 may be replaced by a simple wire and the terminal via capacitor C3 to ground may be omitted completely.

In the shown example, PMOS transistor 17 is connected to a circuit node 15 of a fourth filter circuit, which may be formed by a resistor R4 connected between circuit node 15 and supply voltage 7 and a capacitor C4 connected between circuit node 15 and ground. The fourth filter circuit may correspond, from the dimensioning point of view, to the first to third filter circuit, and like the third filter circuit may be designed as a low-pass filter such that during normal operation of the circuit, supply voltage 7 (3.3 V) is applied at circuit node 15 and thus at the gate terminal of PMOS transistor 17. Similar to the third filter circuit, the fourth filter circuit may also be omitted. It may, however, be advantageous to include the fourth filter circuit, because in the event of an electrostatic discharge, the behavior of the normally floating supply voltage 7 may be barely assessable and circuit node 15 may be pulled by the fourth filter circuit towards ground potential in the event of an ESD pulse. Put another way, a more accurately defined behavior may be present than if the gate terminal of PMOS transistor 17 were wired directly, for example, to supply voltage 7. In this case as well, the gate terminal of PMOS transistor 17 would be pulled by capacitive coupling in the direction of ground potential 2 in the event of an ESD pulse, although with a less clearly defined behavior.

Even with transistors 16, 17, and 18, there may be little or no danger of damaging the gate oxides, because (similar to with transistors 10, 11, and 12) the entire voltage of 5 V may not drop off between drain and gate, gate and source, or gate and bulk. In fact, because a voltage of 5 V may be applied at the gate terminal of PMOS transistor 16 and a voltage of 3.3 V may be applied at the gate terminal of PMOS transmitter 17, the voltage at circuit node 19 may amount to a maximum of 3.3 V+Vtp, where Vtp is a threshold voltage of PMOS transistors 16 and 17, respectively.

In the present example, the voltage of 3.3 V+Vtp at circuit node 19 switches NMOS transistor 4 so as to be conductive. However, as NMOS transistor 5 blocks, as already explained, it may be that no current can flow across NMOS transistors 4, 5. With NMOS transistors 4, 5 as well, it may be that little or no damage may occur to the gate oxides due to excessive voltages as the gate voltage of NMOS transistor 19 is 3.3 V+Vtp.

To stabilize the voltages at circuit nodes 19, 20 at the desired values, it may be desirable to connect high-resistance pull-up and/or pull-down resistors R5 and R6, as indicated by dotted lines in FIG. 2, between circuit node 19 and supply voltage 7 and between circuit node 20 and the terminal for ground 2, respectively. In this way, NMOS transistor 5 may be safely switched off, especially during normal operation of the circuit. High-resistance in this example refers to a resistance greater than 10 kΩ, such as several MΩ.

Next will be described an illustrative behavior of the circuit illustrated in FIG. 1 when an electrostatic discharge is present at terminal 1. In this example, the voltage at circuit nodes 8 and 9 is increased by way of capacitors C1 and C2. This switches PMOS transistor 10 into a blocking state whilst NMOS transistors 11 and 12 are now both conductive. As a result of this, circuit nodes 13 and 14 are at ground potential or are pulled in the direction of ground potential. In the case of circuit node 13, this is additionally assisted by third filter circuit R3, C3. Furthermore in this example, the potential at circuit node 15 is reduced by fourth filter circuit R4, C4, and even circuit node 15 lies substantially at ground potential in the case of an ESD pulse. Thus ground potential is applied at the gate terminals of PMOS transistors 16, 17 and NMOS transistor 18, which may have the effect that PMOS transistors 16 and 17 are switched so as to be conductive and NMOS transistor 18 is switched so as to be blocking. As a result of this, the voltage at circuit nodes 19 and 20 may be increased since these are now linked to terminal 1 by way of PMOS transistors 16 and 17 so as to be conductive, which in turn switches NMOS transistors 4 and 5 so as to be conductive such that the electrostatic discharge may drain away to ground by way of NMOS transistors 4 and 5.

As already mentioned, it may be desirable for the first filter circuit and/or the second filter circuit to provide the appropriate control signals for long enough so that substantially the entire electrostatic discharge may drain away via NMOS transistors 4 and 5, which may mean that a large time constant of the first and second filter circuit may be desirable. The same may apply to the third and/or fourth filter circuits.

On the other hand, the corresponding time constants may be so short that NMOS transistors 4 and 5 are not both switched to be conductive in normal operation of the circuit. In such a case, a time constant of, e.g., approximately 50 nanoseconds, may possibly be critical by comparison with the typical duration of an electrostatic discharge of, e.g., approximately 150 nanoseconds.

Figure 3:
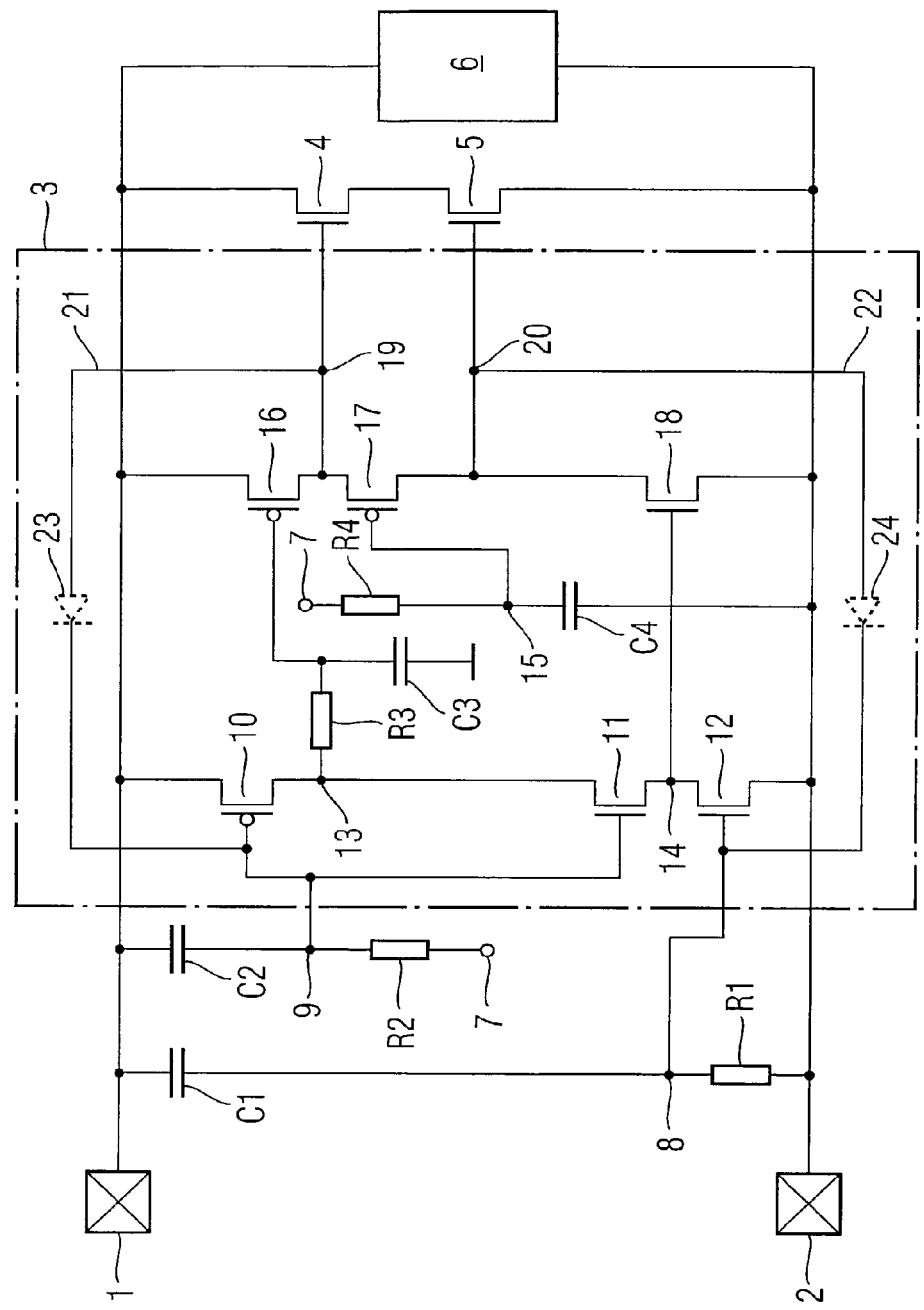
FIG. 3 is a schematic diagram of another illustrative wired-circuit embodiment of the circuit arrangement from FIG. 1.

To balance this out, FIG. 3 shows an illustrative embodiment that is a modification of the circuit from FIG. 2, in which feedback paths 21, 22 are provided. The circuit of FIG. 3 corresponds to the circuit of FIG. 2 except for these feedback paths. For this reason, only the function of feedback paths 21, 22 will be explained, and reference will be made to the description above with respect to the remainder of the circuit.

In the example of FIG. 3, feedback path 21 connects circuit node 19 (the gate terminal of NMOS transistor 4) to circuit node 9 (the output of the second filter circuit or the gate terminal of PMOS transistor 10), and feedback path 22 connects circuit node 20 to circuit node 8. If then, as described above, the voltage at circuit nodes 19 and 20 (the gate terminals of NMOS transistors 4 and 5) rises upon the occurrence of an ESD pulse at terminal 1, this would be fed back to the input of the first driver stage at circuit nodes 8 and 9 and thus the rise in voltage brought about by the first and second filter circuit would be amplified. As a result of this, NMOS transistors 4 and 5 may be kept conductive for a longer overall time. The feedback paths may effectively increase the time constant of the first and second filter circuit. Another possibility for increasing the time constants may be to correspondingly alter capacitors C1, C2 and/or resistors R1, R2 to adjust a predetermined time constant, such as about 200 ns. This adjustment may be carried out in addition to the feedback paths.

Diodes 23 and 24—indicated by dotted lines in FIG. 3—may further be provided. These diodes may reduce or prevent a feed forward current flow between circuit nodes 8 and 9 and circuit nodes 19 and 20, which might lead to a portion of the voltage rise at circuit nodes 8 and 9 at the beginning of an ESD pulse not being used to control transistors 10, 11 and 12 of the first driver stage but rather for charging the gate electrodes of NMOS transistors 4 and 5 and thus being lost. In the circuit of FIG. 3, it may be desirable to dispense with pull-up and/or pull-down resistors R5, R6, respectively, from FIG. 2, because here a corresponding pull-up/pull-down effect may be already achieved by resistors R1 and R2, respectively.

Figure 4:
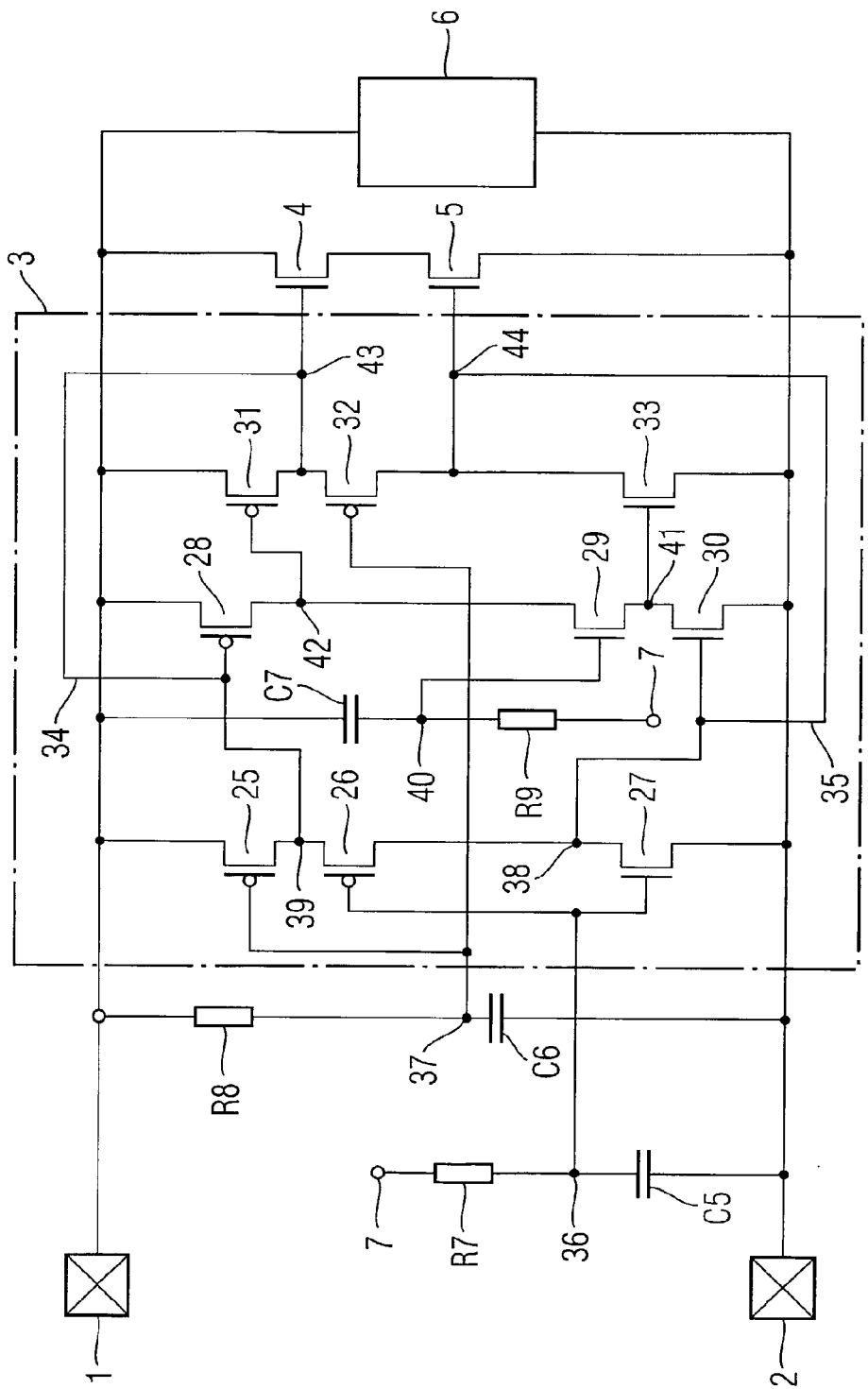
FIG. 4 is a schematic diagram of yet another illustrative wired-circuit embodiment which represents a variation of the embodiments in FIGS. 1-3, FIGS. 5A to 5D are graphs showing illustrative results of simulations of the embodiment from FIG. 2.

FIG. 4 shows another illustrative embodiment of driver circuit 3. Unlike FIGS. 2 and 3, the driver circuit of FIG. 4 includes three driver stages, wherein a first stage is formed from a pair of stacked PMOS transistors 25 and 26 and an NMOS transistor 27, a second stage from a PMOS transistor 28 and a pair of stacked NMOS transistors 29 and 30, and a third stage from a pair of stacked PMOS transistors 31 and 32 plus an NMOS transistor 33. Similar to FIG. 2, a first filter circuit including a resistor R8 and a capacitor C6, in addition to a second filter circuit including a resistor R7 and a capacitor C5, is provided. Unlike the first and second filter circuits from FIGS. 1 and 2, the first filter circuit and the second filter circuit from FIG. 4—similar to the fourth filter circuit from FIGS. 2 and 3—are connected as low-pass filters. Thus, during normal operation of the circuit, circuit nodes 37 and 36, which correspond to outputs of the first and second filter circuits respectively, may be at the potential of terminal 1 and supply voltage 7 respectively. This "reversal" of the filter behavior of the first and second filter circuits may be dependent upon the fact that the polarities or charging types of the MOS transistors in the first driver stage may be also switched over in relation to FIGS. 2 and 3.

The voltages applied to circuit nodes 38 and 39 may serve for activation of the second driver stage, especially of NMOS transistor 30 and PMOS transistor 28, respectively, whereas NMOS transistor 29 may be activated by way of a circuit node 40 of a third filter circuit formed by a capacitor C7 and a resistor R9. The third filter circuit is connected in this example as a high-pass filter. Otherwise, the second driver stage and the third driver stage from FIG. 4 correspond substantially to the driver stages from FIG. 3, wherein circuit node 41 and 42 of the second driver stage is interconnected to gate inputs of NMOS transistor 33 and PMOS transistor 31 respectively, whilst a gate terminal of PMOS transistor 32 is interconnected to circuit node 37. In other words, it "shares" the first filter circuit with PMOS transistor 25. The third filter from FIGS. 2 and 3, formed from resistor R3 and capacitor C3, are not shown in the driver circuit of FIG. 4 but may be included as desired.

In the present example, the gate terminals of NMOS transistors 4 and 5 serving as ESD protective elements are interconnected to circuit node 43 and 44, respectively, from which feedback paths 34, 35 may lead to inputs of the third driver stage, as illustrated. The function of these feedback paths corresponds to that of feedback paths 21, 22 from FIG. 3. Here, too, it may be desirable to provide diodes (not shown).

In general, it may be desirable in the case of driver circuits that, similar to those shown in FIGS. 2 to 4, have a polarity that changes from one driver stage to another, thus in which the driver stages display an inverting behavior, for feedback paths such as those shown in FIGS. 3 and 4 to bridge an even number of driver stages—two in the present examples—in order to provide a correct behavior.

The method of functioning of driver circuit 3 of FIG. 4 corresponds substantially to that of FIGS. 2 and 3, wherein an additional driver stage is present that may lead to a sharper transfer behavior and/or a stronger (and thus potentially advantageous) bias of the gate terminals of NMOS transistors 4 and 5.

Even in the circuit from FIG. 4 it may be desirable to provide pull-up and/or pull-down resistors in addition to or as a replacement for feedback paths 34, 35 corresponding to resistors R5 and R6 from FIG. 2.

An illustrative method of functioning of the circuit arrangement will now be described. In this terminal, FIGS. 5A to 5D show illustrative simulation results of the circuit arrangement from FIG. 2, and FIGS. 6A to 6D show corresponding illustrative simulation results of the circuit arrangement from FIG. 3, i.e. with a feedback path. At the same time, the behavior of the circuit is simulated for a supply voltage of 3.3 V applied to terminal 1 and a supply voltage 7 of 1.8 V, which may not result in any fundamental difference from the 5 V/3.3 V combination previously described.

In this example, the value 1 pF is used in each case for capacitors C1 and C2, the value 10 pF for capacitor C4 and 50 kΩ for resistors R1, R2 and R4. In this terminal, individual PMOS transistors such as PMOS transistor 10 may have a width of, e.g., about 20 μm and stacked PMOS transistors such as PMOS transistors 16 and 17 may have a width of, e.g., about 40 μm per transistor. This may achieve a driver width corresponding to a single 20 μm PMOS transistor. For the NMOS transistors, these values may be halved, for example. Thus, this may result in a width of 10 μm for individual NMOS transistors such as NMOS transistor 18, and 20 μm per transistor for stacked NMOS transistors such as NMOS transistors 11 and 12. The gate length of the transistors may be, for instance, the minimum allowed by the respective circuit design.

NMOS transistors 4 and 5 serving as an ESD protective element may have a width of 1,000 μm; this value is also used for the illustrative simulations described herein.

Figure 5A:
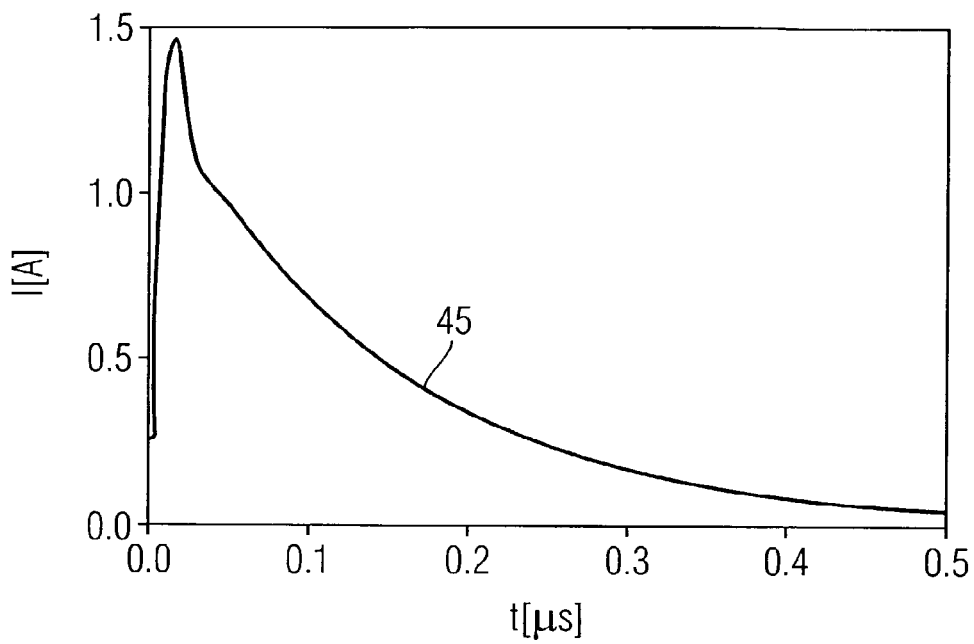

Curve 45 in FIG. 5A shows in amps the course of the current I, flowing between terminal 1 and terminal 2, as a function of the time t in μsec upon the application of an ESD pulse at terminal 1. This current flows for the most part across NMOS transistors 4 and 5, and a smaller fraction also flows as cross current across driver circuit 3 during the switching processes described. As can be seen from FIG. 5A, there is initially a steep rise in the current followed by a relatively slow drop.

Figure 5B:
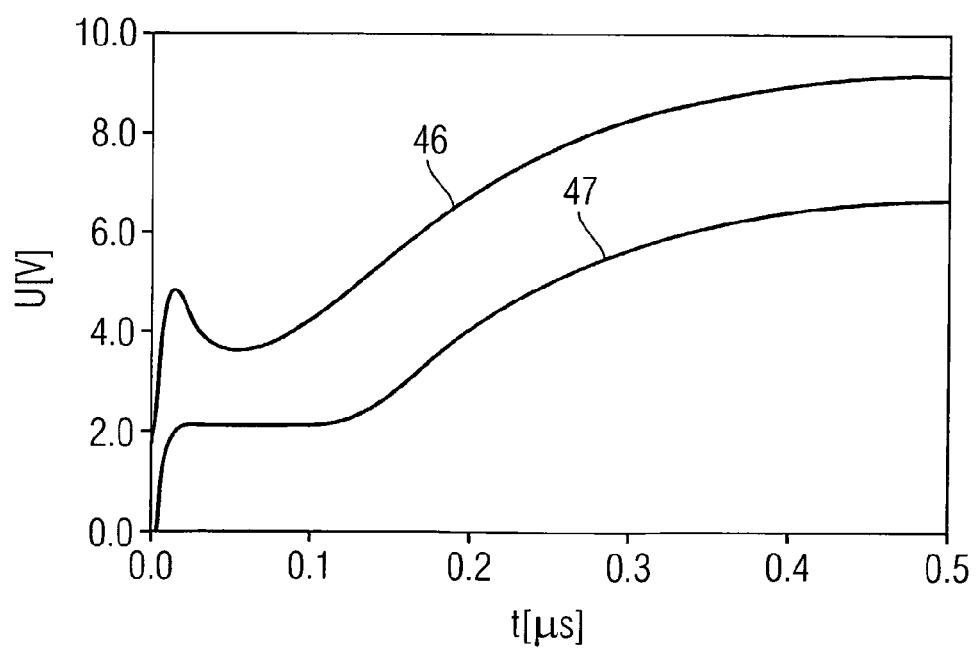
Figure 5C:
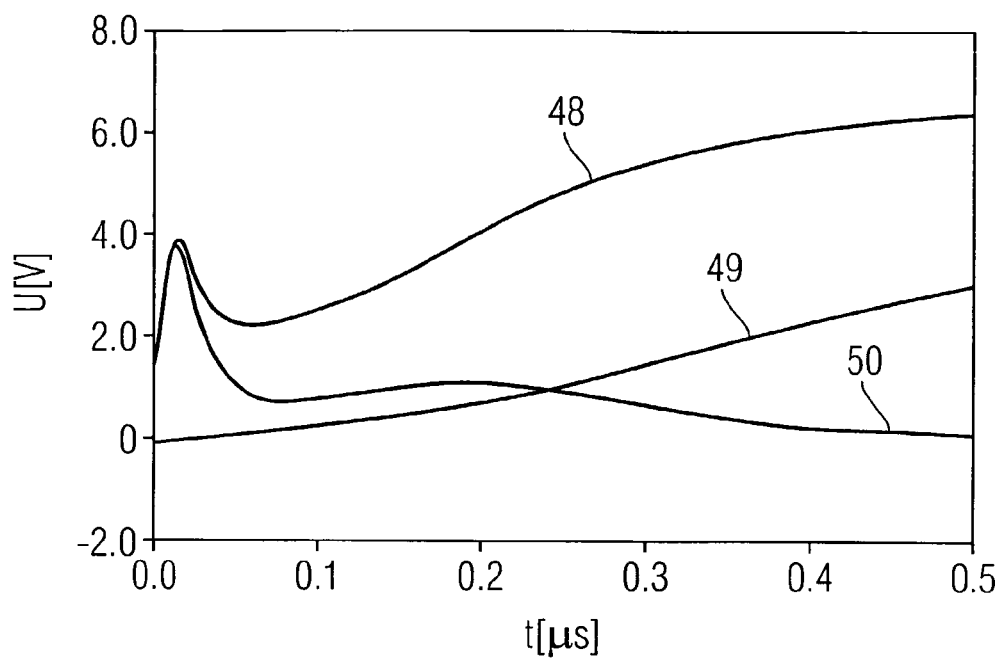
Figure 5D:
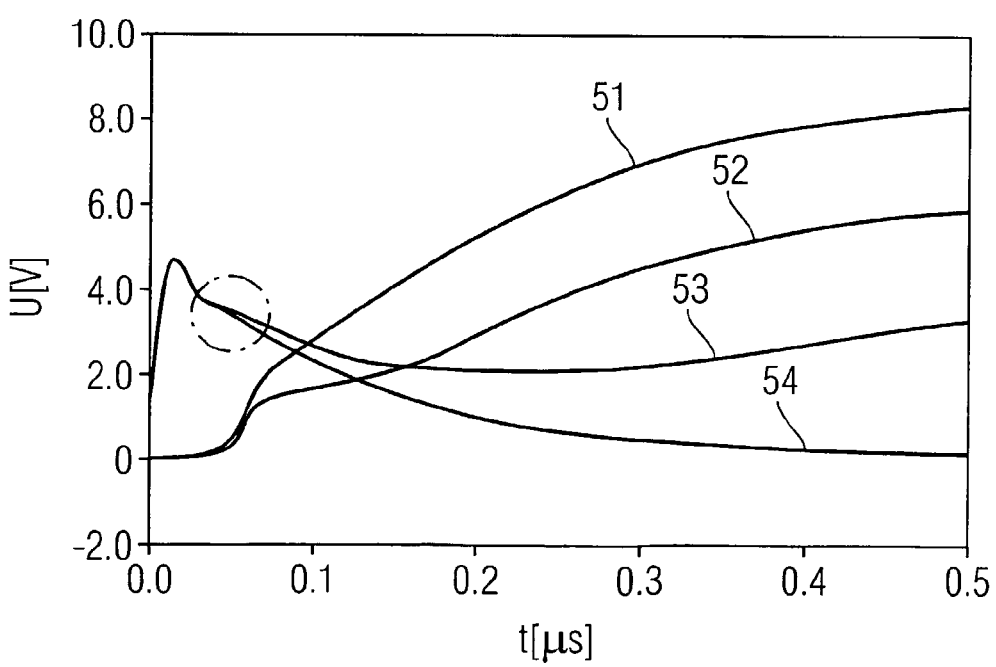

FIG. 5B shows the voltage curve between terminals 1 and 2 (curve 46) and between supply voltage 7 and terminal 2 (curve 47) respectively. In FIG. 5C, curve 48 shows the course of the voltage at circuit node 9, curve 49 shows the course of the voltage at circuit node 15, and curve 50 shows the course of the voltage at circuit node 8. FIG. 5D shows in curve 51 the course of the voltage at circuit node 13, in curve 52 the course of the voltage at circuit node 14, in curve 53 the course of the voltage at circuit node 19, and in curve 54 the course of the voltage at circuit node 20.

In this example, a circle marks the point at which curves 53 and 54, i.e. the voltages at circuit nodes 19 and 20, diverge. This divergence may arise due to the fact that with the time constants of the first and second filter circuit (R0×C0=R1× C1=50 nanoseconds), the voltage may drop off again at circuit nodes 8 and 9. This is shown in curves 48 and 50. The same may also apply correspondingly for the fourth filter circuit with capacitor C4 and resistor R4, although with a larger time constant because C4 is chosen in this example to be larger than C1 and C2. Accordingly, as can be seen in curves 51 and 52, the voltage at circuit nodes 13 and 14 also rises again, which correspondingly may lead to the divergence of the gate voltages of NMOS transistors 4 and 5, as shown in curves 53 and 54, which may be different anyway during normal operation of the circuit. As a result, the conductivity of NMOS transistor 5 may become poorer, which may lead to a corresponding increase in voltage between terminal 1 and terminal 2 as shown in curve 46 of FIG. 5B, and also to a corresponding increase in voltage between supply voltage 7 and terminal 2 as shown in curve 47. At the same time, however, the voltage between terminal 1 and terminal 2 (terminal voltage) remains constantly below 10 V. In this case, the circuit arrangement, especially NMOS transistors 4 and 5, may be dimensioned such that little to no damage occurs at this voltage.

As already explained, the use of a feedback path may increase the effective time constant of the filter circuits. In this terminal, FIGS. 6A to 6D show current or voltage curves respectively corresponding to FIGS. 5A to 5D for the circuit of FIG. 3, i.e. with a feedback path. Curve 55 in FIG. 6A in turn shows the current flowing between terminals 1 and 2 on the occurrence of an ESD pulse at terminal 1, whereby curve 55 corresponds substantially to curve 45 from FIG. 5A. Curve 56 in FIG. 6B, corresponding to curve 46 from FIG. 5B, shows the course of the voltage between terminal 1 and terminal 2, curve 57 corresponding to curve 47 shows the course of the voltage between supply voltage 7 and terminal 2. Curve 58 corresponds to curve 48, curve 59 to curve 49 and curve 60 to curve 50. On comparing FIGS. 6B to 6D with FIGS. 5B to 5D, it should be noted that the voltage scales are different, and in FIGS. 6B to 6D especially the voltage scales only extend to 5 V.

Figure 6A:
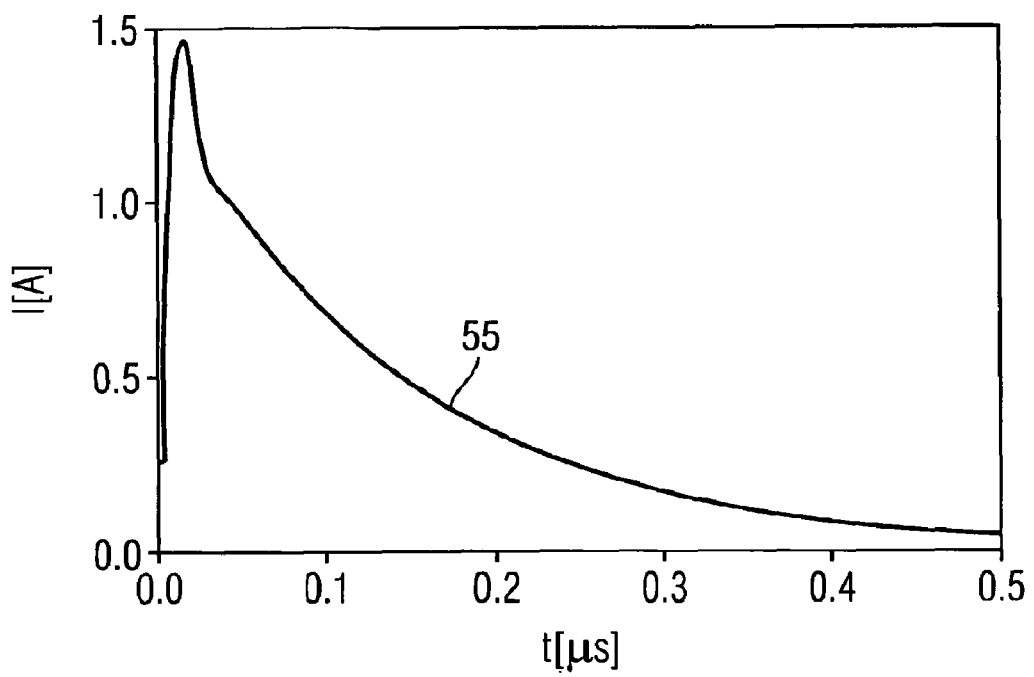
FIGS. 6A to 6D are graphs showing illustrative results of simulations of the embodiment from FIG. 3.
Figure 6B:
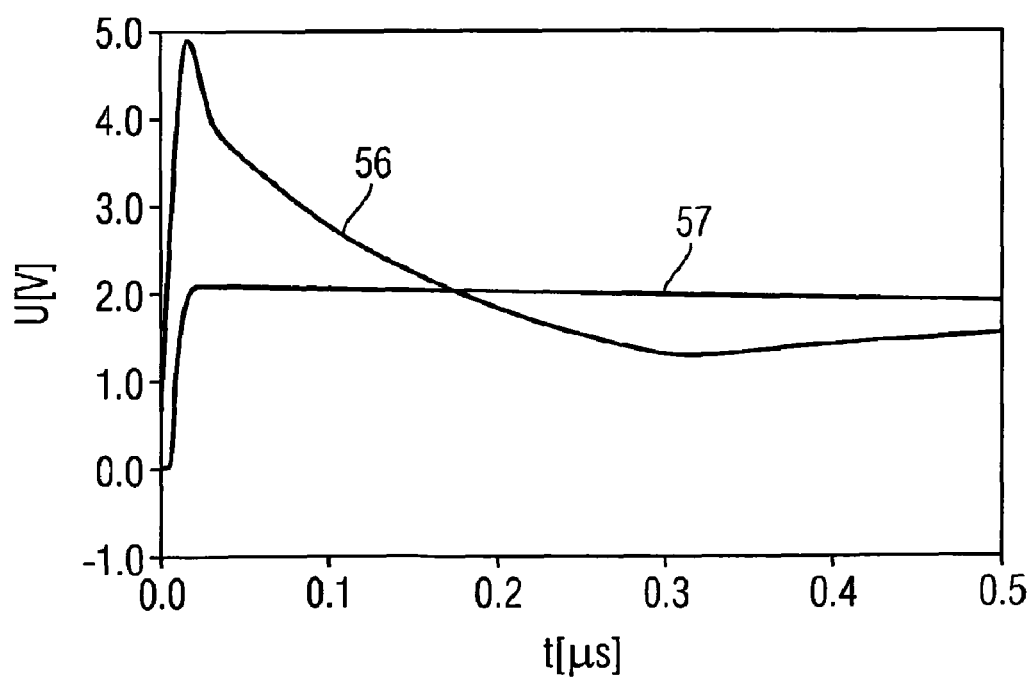
Figure 6C:
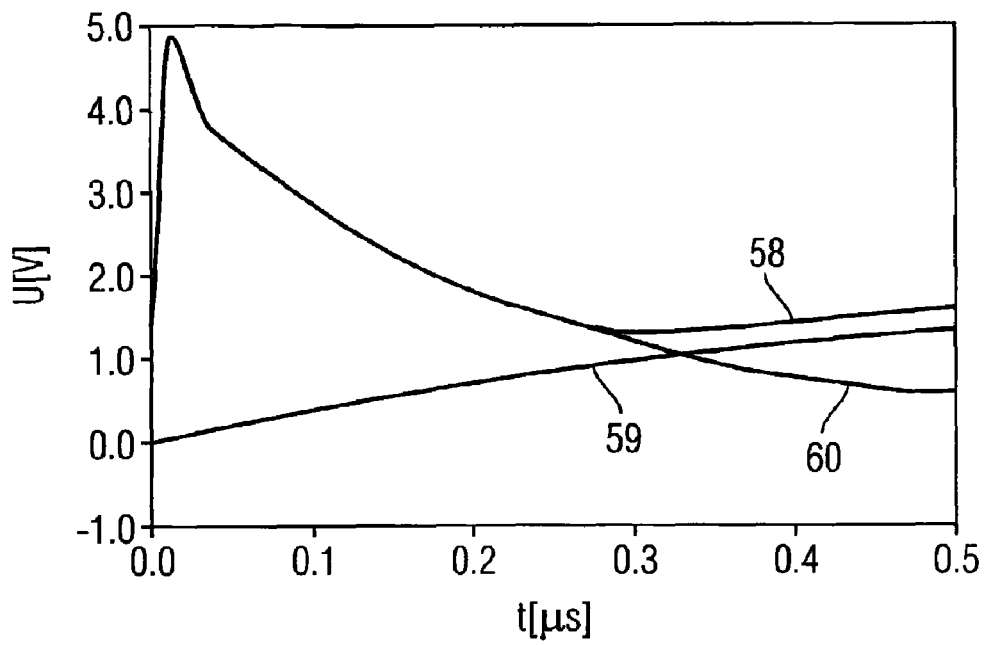
Figure 6D:
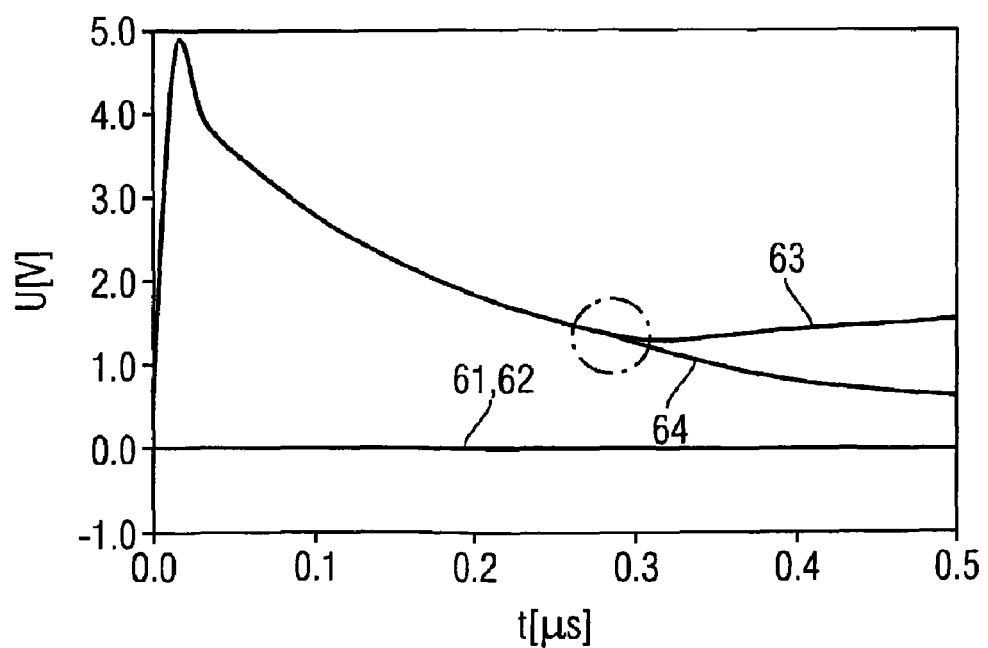

As can especially be seen from FIGS. 6C and 6D, the voltages at circuit nodes 8 and 9 (at the outputs of the first filter circuit and the second filter circuit), as can be seen in curves 58 and 60, and voltages 63 and 64 (at the gate terminals of NMOS transistors 4 and 5), as identified by a circle in FIG. 6D, may not diverge until a substantially later point than in the case without feedback. Furthermore, the voltage at the gate terminal of NMOS transistor 5, i.e. at circuit node 20, may decrease more slowly with the possible result that this transistor remains conductive for longer. Accordingly, the increase in voltage between terminals 1 and 2 as well as between supply voltage 7 and terminal 2, as can be seen in FIG. 5B, may no longer be observed, as FIG. 6B shows. The peak voltage between terminals 1 and 2 is now only 4.8 V, which illustrates the circuit arrangement's good terminal behavior during transient ESD pulses.

With the various illustrative embodiments of circuits presented, it may be desirable that the gate oxides of the PMOS and NMOS transistors used do not experience any degradation, or at least any significant degradation, whereby during normal operation of the circuit, fixed voltages, especially at the gate terminals of the transistors, may be present such that permissible gate-source voltages, gate-drain voltages and gate-bulk voltages are not exceeded. By differentiating between normal operation of the circuit and the application of an ESD by means of the filter circuits, it may be possible to bypass the problem, that with conventional ESD protective circuit arrangements there may be almost no margin between the increased supply voltage applied—at terminal 1 in the present case—and the maximum voltage allowed before the protective circuit arrangement becomes conductive to prevent damage to the gate oxides. The illustrative circuits presented may achieve the lowest possible threshold values for the typical duration of an ESD pulse for the voltages that switch the protective circuit, especially NMOS transistors 4 and 5, so as to be conductive. At the same time, as is demonstrated by the previously-described simulations, good values may be achieved for the terminal voltage, i.e. the voltage between terminal 1 and terminal 2.

The various circuits presented are merely to be understood as examples, and many variations are within the scope of this disclosure. For example, the driver circuit may include more or less driver stages than as presented. It is also be desirable to use transposed polarities of various components (including the protective elements), such as using NMOS instead of PMOS transistors and vice versa, and filter circuits correspondingly designed otherwise (for example, low-pass filters instead of high-pass filters and vice versa). The use of other or additional protective elements may be used, e.g., an expansion to three stacked protective elements. Moreover, the present disclosure is not limited to application in circuits that offer a 5 V or a 3.3 V supply voltage level, and more generally may be used where an ESD protective circuit arrangement is desired for a terminal at which, in normal operation, a voltage greater than a core supply voltage of the circuit is present.

The invention claimed is:
1. An apparatus, comprising:
a first circuit node;
a second circuit node;
a first capacitor and a first resistor coupled in series between the first circuit node and the second circuit node;
a third circuit node disposed between the first capacitor and the first resistor;
a control circuit coupled to the first, second, and third circuit nodes, and configured to output a first control signal at a fourth circuit node and a second control signal at a fifth circuit node responsive to an increase in voltage at the third circuit node; and
a first transistor and a second transistor coupled in series between the first circuit node and the second circuit node, wherein a gate of the first transistor is coupled to the fourth circuit node and a gate of the second transistor is coupled to the fifth circuit node,
wherein the control circuit comprises:
third, fourth, and fifth transistors having source/drain paths coupled in series with each other between the first circuit node and the second circuit node; and
sixth, seventh, and eighth transistors having source/drain paths coupled in series with each other between the first circuit node and the second circuit node, and
wherein a gate of the sixth transistor is coupled to a circuit node between the third and fourth transistors, a gate of the seventh transistor is coupled to a fixed potential, and a gate of the eighth transistor is coupled to a circuit node between the fourth and fifth transistors.

2. The apparatus of claim 1, wherein the first circuit node is coupled to a power supply and the second circuit node is coupled to ground.

3. The apparatus of claim 1, further comprising:
   a second capacitor and a second resistor coupled in series between the first circuit node and a sixth circuit node; and
   a seventh circuit node disposed between the second capacitor and the second resistor,
   wherein the control circuit is further coupled to the seventh circuit node.

4. The apparatus of claim 3, wherein the first circuit node is coupled to a first power supply, the sixth circuit node is coupled to a second power supply, and the second circuit node is coupled to ground.

5. The apparatus of claim 3, wherein the first, second, and sixth circuit nodes are each coupled to a different fixed potential.

6. The apparatus of claim 1, wherein the control circuit further comprises a second resistor, and the gate of the seventh transistor is coupled to the fixed potential through the second resistor.

7. The apparatus of claim 1, wherein the fourth circuit node is a circuit node between the sixth and seventh transistors and the fifth circuit node is a circuit node between the seventh and eight transistors.

* * * * *